United States Patent [19]

Kurpan

[11] Patent Number: 4,900,955
[45] Date of Patent: Feb. 13, 1990

[54] VOLTAGE SHARING CIRCUIT

[75] Inventor: Vincent E. Kurpan, Greenfield, N.H.

[73] Assignee: Sanders Associates, Inc., Nashua, N.H.

[21] Appl. No.: 369,785

[22] Filed: Jun. 19, 1989

Related U.S. Application Data

[63] Continuation of Ser. No. 47,791, May 6, 1987, abandoned.

[51] Int. Cl.[4] ............... H03K 17/284; H03K 17/687; H03K 17/08; H03K 17/288
[52] U.S. Cl. .......................... 307/568; 307/296.1; 307/571; 307/584; 307/304; 330/297
[58] Field of Search ............... 307/571, 542, 254, 584, 307/581, 570, 577, 304, 296.1; 330/263, 297, 256, 258, 253, 71; 328/67, 72; 361/91

[56] References Cited

U.S. PATENT DOCUMENTS

| | | | |
|---|---|---|---|
| Re. 27,972 | 4/1974 | Borror | 307/200 B |
| 3,622,899 | 11/1971 | Eisenberg | 330/263 |
| 3,671,749 | 6/1972 | Harnden | 307/311 |
| 4,070,589 | 1/1978 | Martinkovic | 328/67 |
| 4,283,674 | 8/1981 | Kominami et al. | 323/313 |
| 4,367,421 | 1/1983 | Baker | 307/550 |
| 4,479,094 | 10/1984 | Harris | 330/261 |
| 4,481,483 | 11/1984 | Kawamura | 330/297 |
| 4,484,151 | 11/1984 | Nijman et al. | 330/297 |
| 4,677,391 | 6/1987 | Kawakami | 330/296 |

OTHER PUBLICATIONS

Glover, "Using Low Voltage Transistors in High Voltage Circuits", Jul. 6, 1964, Electronic Design, pp. 23–29.

Primary Examiner—John S. Heyman
Assistant Examiner—Nancy Thai
Attorney, Agent, or Firm—Richard I. Seligman; Stanton D. Weinstein; Mark Levy

[57] ABSTRACT

A voltage sharing circuit which allows use of low voltage semiconductor devices to obtain higher output voltages is made up of a series stack of the low voltage devices with diode limiters provided to bias the low voltage devices such that the maximum voltage across any one of the low voltage devices is limited to a predetermined value.

36 Claims, 2 Drawing Sheets

VOLTAGE SHARING CIRCUIT

This is a continuation of Ser. No. 047,791, filed 5/6/87, now abandoned.

BACKGROUND OF THE INVENTION

This invention relates to high voltage, high speed circuits and, more particularly, to such circuits in which the required voltage swings exceed the voltage rating of semiconductor devices which can operate at the required high speed.

Many applications require high speed semiconductor devices for amplification or switching where the required voltage swings exceed the rating of the available devices. For example, a need arose for a video amplifier to drive the cathode ray tube (CRT) of a high resolution raster scan display. The CRT needed to be driven with a 50 volt signal at 360 MHz (1.2 ns rise and fall time) rate. Frustration with bipolar (conventional) transistors led to the investigation of Gallium Arsenide FET devices which are superior to bipolar devices in some very important areas (high current with low capacitance primarily). FETs, however, are low voltage devices and would not accommodate the required 50 volt swing.

Accordingly, it was decided to investigate the sharing of voltage by using multiple FETs in the manner shown in FIG. 1. In this arrangement a plurality of FETs 10, 12 and 14 are connected in series and a conventional resistive voltage divider 16 employed. This arrangement did allow sharing of output voltage such that each device shared 1/n of the output voltage where n equals the number of FETs used. However, the resistive divider caused oscillations. The oscillations were caused by phase shifts that occurred in the feedback of the resistive divider in conjunction with the parasitic capacitances of the devices. A similar resistive divider network as tried with selected bipolar devices but impedence problems arose due to the large base currents. Also the Miller effect became a problem when using a resistive divider network.

Accordingly, it is an object of this invention to provide a high speed, high voltage circuit.

It is another object of this invention to provide a high speed, high voltage circuit using low voltage devices.

SUMMARY OF THE INVENTION

Briefly, in one embodiment of the invention, a voltage sharing circuit is provided which allows the use of low voltage FETs to obtain high voltage outputs. A stack of FET devices is connected in series with the drain electrode of one FET connected to the source electrode of the next FET in the stack. An input signal is applied to the gate electrode of the first FET at one end of the stack and the output signal is derived at the drain electrode at the nth FET at the other end of the stack.

Diodes are connected between reference voltages and the gate electrodes of each of the FETs except for the first or input FET. The reference voltages are selected in order to limit the maximum voltage which can be developed across all of the FETs except for the nth FET. The gate bias is provided by a resistor from drain to gate and is, then, limited In order to limit the maximum power consumed by the FETs, the reference voltages can be tapered so that the lower the FET is in the stack the less the maximum voltage which is permitted to develop across the FET.

BRIEF DESCRIPTION OF THE DRAWINGS

The above-mentioned and other features and objects of this invention will become more apparent by reference to the following description taken in conjunction with the accompanying drawings, in which.

DESCRIPTION OF PREFERRED EMBODIMENTS

Figure 1:
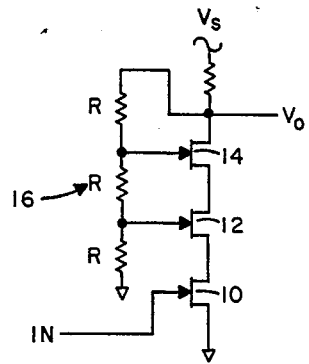
FIG. 1 is a schematic of a voltage sharing circuit employing a resistive divider network.
Figure 2:
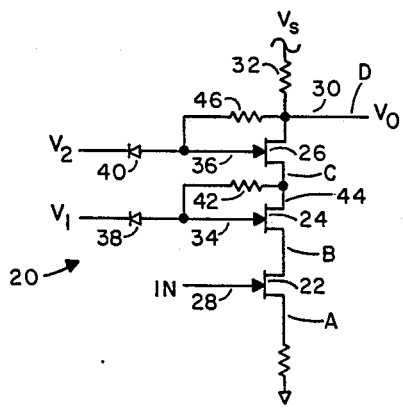
FIG. 2 is a schematic of a voltage sharing circuit employing diode limiters in accordance with the principles of this invention.

Referring now to FIG. 2 of the drawings there is illustrated a voltage sharing amplifier 20 configured in accordance with the principles of this invention. The amplifier includes a grounded source FET 22 having a second FET 24 and a third FET 26 connected in series therewith. The signal to be amplified is applied to the gate electrode 28 of FET 22 and the output from the amplifier is taken at the drain 30 of FET 26. The supply voltage $V_S$ for the circuit is connected to drain 30 via a resistor 32.

Reference voltages $V_1$ and $V_2$ are coupled to the gates 34 and 36 of FETs 24 and 26, respectively, through diodes 38 and 40. A resistor 42 is connected between gate 34 and the drain 44 of FET 24 and another resistor 46 is connected between gate 36 and drain 30 of FET 26. Although three FETs are shown, this is exemplary only. The number of devices required depends upon the required voltage swing and the rating of the devices. Thus, the circuit may employ only two devices or more than two devices.

The individual FET devices of FIG. 2 are protected from excessive voltages while the output voltage ($V_0$) is beyond the rating of any one of the devices. Thus, large voltage swings are achieved with low voltage devices. The output voltage may exceed the ratings of any one of the devices by many times.

The reference voltage $V_1$ is equal to the magnitude of $V_{DSmax}$ (the maximum drain to source voltage less the magnitude of $V_p$ (pinch off voltage) or $|V|$. $V_2$ is equal to $V_1 + |V_{DSmax}|$. If additional devices were stacked then $V_3$ would be made equal to $V_2 + |V_{DSmax}|$, etc..

When the output voltage $V_0$ is nominally less than $V_1 + |V_p|$ all of the output is across FET 22 and FETs 24 and 26 act as short circuits. When $V_0$ nominally increases beyond $V_1 + |V_p|$ but less than $V_2 + |V_p|$ then a portion of the output voltage is across FET 24 and FET 26 acts as a short circuit. When $V_0$ nominally exceeds $V_2 + |V_p|$ then the remainder of the output voltage is across FET 26 as well, that is, all of the FET devices share the output voltage. This occurs because the gate voltage for FET 24 can never exceed $V_1$ (except for diode drop) and the gate voltage for FET 26 can never exceed $V_2$ (except for diode drop). The pinch off voltage is a worst case value. In most designs the reference voltage will be selected so that, for example, the second FET in the stack will start sharing voltage before it reaches $V_1+|V_p|$. Note magnitudes of $V_p$ are used since in the example shown depletion mode, n-channel JFETs are used and, therefore, V is negative. Of course, when p-channel and n-channel enhancement mode devices are used the signs shown above would be incorrect.

Figure 3:
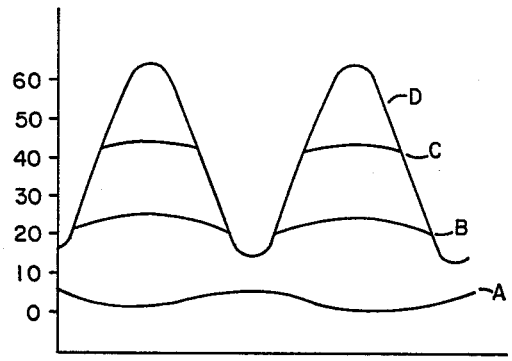
FIG. 3 is a series of waveforms illustrating the signals taken at various points of the schematic of FIG. 2.

FIG. 3 illustrates the signals taken at various points in FIG. 2 and clearly shows the result of stacking FETs to obtain large voltage swings with low voltage devices. Waveforms A, B, C and D are taken at points A, B, C and D in FIG. 2.

Stacked FET devices using a diode divider are very stable. The circuit has two states or modes of operation. When the voltage across the device is above the reference voltage, the diode will limit the gate voltage at the nominal reference voltage. Thus, in this mode the gate voltage is fixed and the circuit is a conventional cascode which is well known to be stable and desirable at high speeds. In the mode where the voltage drops below the reference voltage the diode is reverse biased and essentially does not exist. Therefore, the device is simply biased on by the resistor connecting the drain to the gate (resistors 42 and 46) and, thus, very stable in this state because the particular device is not acting as a linear element.

Although this embodiment is illustrated using FET devices, bipolar devices could be used instead. In fact the principles are applicable to any active electronic device including vacuum tubes. Preferably the diodes are Schottky diodes because of their low capacitance and speed characteristics. While separate reference voltages are indicated, preferably the reference voltages are derived from a single source and divided with zener diodes which precisely define the reference voltage values.

One drawback to this arrangement is that the lower devices in the stack bear more of the voltage load (statistically) because they would be limited at full voltage unless the output dropped quite low. As the current fluctuated up and down with the signal then, the lower devices in the stack would dissipate more power because the lower the device in the stack, the more often it would be at full voltage. One solution to this problem is to "taper" the voltages, giving the lower devices in the stack a lower voltage stress to equalize power dissipation.

Therefore, for example, in FIG. 2, reference voltage $V_1$ would be less than $|V_{DSmax}|-|V_p|$ in order to reduce the power in FET 22. Likewise $V_2$ may be made less than $V_1+|V_{DSmax}|$. Note, however, that additional FETs may be required in the stack to accommodate the full output voltage when using tapered reference voltages.

In some instances where a single device can tolerate the required output voltage swing, it is still desirable to stack multiple devices for power sharing. This is preferred to paralleling in some cases.

Figure 4:
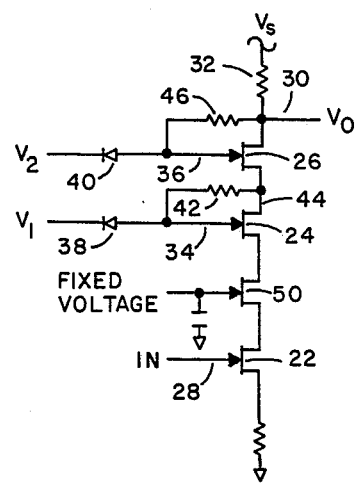
FIG. 4 is a schematic of a voltage sharing circuit like that of FIG. 2 with the addition of a common cascode device.

FIG. 4 illustrates another embodiment of the invention. It is like the embodiment of FIG. 2 with the addition of another FET 50 as a cascode. This optional cascode is added to alleviate Miller effect on the input. When the output voltage is nominally less than $V_1+|V_p|$, the drain of FET 22 does not have its voltage fixed and, therefore, the Miller effect can be a problem in that range. The cure for this is to insert a cascode above it. Additional cascodes are not needed for the upper devices since they become cascodes inherently above some level and are short circuits otherwise.

Figure 5:
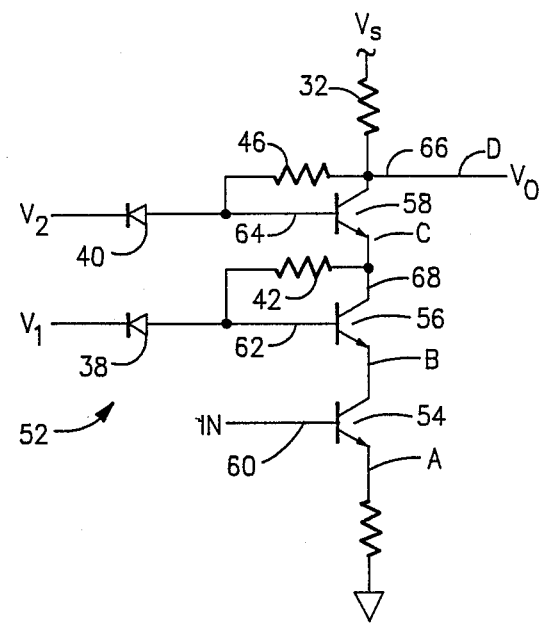
FIG. 5 is a schematic diagram of another voltage sharing circuit employing diode limiters in accordance with the principles of this invention.

In FIG. 5 of the drawings there is illustrates a voltage sharing amplifier 52 configured in accordance with the principles of this invention. FETs 22, 24 and 26 of FIG. 2 are replaced in FIG. 5 with bipolar devices 54, 56 and 58, each including a respective base electrode 60, 62 or 64. Bipolar device 58 includes collector electrode 66. Bipolar device 56 includes collector electrode 68.

Figure 6:
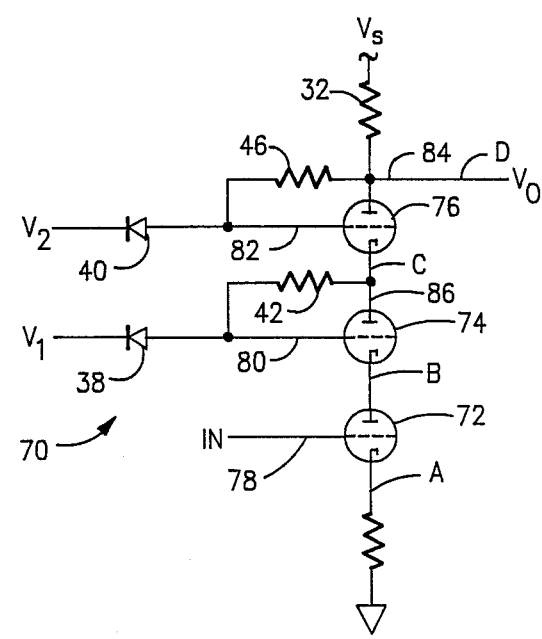
FIG. 6 is a schematic diagram of yet another voltage sharing circuit employing diode limiters in accordance with the principles of this invention.

In FIG. 6 of the drawings there is illustrates a voltage sharing amplifier 70 configured in accordance with the principles of this invention. FETs 22, 24 and 26 of FIG. 2 are replaced in FIG. 6 with vacuum tubes 72, 74 and 76, each including a respective grid electrode 78, 80 or 82. Vacuum tube 76 includes plate electrode 84. Vacuum tube 74 includes plate electrode 86.

Although the circuit describing the invention is an amplifier, the principles of the invention are applicable to other types of circuitry where the output voltage exceeds the individual ratings of the semiconductors, such as switching circuits. Thus, it is to be understood that the embodiments described are illustrative only and that many variations and modifications can be made without departing from the principles of the invention herein disclosed and defined by the appended claims.

I claim:

1. A voltage sharing circuit, comprising:
   a first active electronic device having at least first, second and third electrodes and having a predetermined voltage rating;
   a second active electronic device having at least first, second and third electrodes and having a predetermined voltage rating, said first electrode of said second active electronic device being coupled to said second electrode of said first active electronic device;
   means for receiving an input signal only at said third electrode of said first active electronic device;
   means for providing an output signal at said second electrode of said second active electronic device, the voltage of said output signal being greater than said voltage rating of said first active electronic device;
   a supply voltage source coupled to said second electrode of said second active electronic device;
   a first source of fixed reference voltage;
   a first impedance device coupling said second and third electrodes of said second active electronic device; and
   a first diode intermediate said first source of fixed reference voltage and said third electrode of said second active electronic device to limit the maximum voltage with respect to ground potential on said third electrode of said second active electrode device.

2. A voltage sharing circuit as defined in claim 1, wherein said active electronic devices are FETs and said first electrodes are source electrodes, said second electrodes are drain electrodes and said third electrodes are gate electrodes.

3. A voltage sharing circuit as defined in claim 1, wherein said active electronic devices are bipolar devices and said first electrodes are emitter electrodes, said second electrodes are collector electrodes and said third electrodes are base electrodes.

4. A voltage sharing circuit as defined in claim 1, wherein said active electronic devices are vacuum tubes, said first electrodes are cathodes, said second electrodes are plates, said third electrodes are grids, and said first diode is connected such that its positive-current forward-bias direction is oriented away from said grid of said second active electronic device.

5. A voltage sharing circuit as defined in claim 1, wherein said active electronic devices are semiconductors.

6. A voltage sharing circuit as defined in claim 1, wherein said first electrode of said first active electronic device is grounded.

7. A voltage sharing circuit as defined in claim 5, wherein said first source of fixed reference voltage has a predetermined value selected to prevent excess voltage developing across said second active electronic device.

8. A voltage sharing circuit as defined in claim 7, wherein said active electronic devices are n-channel, depletion mode JFETs and said first electrodes are source electrodes, said second electrodes are drain electrodes and said third electrodes are gate electrodes, and said first source of fixed reference voltage is nominally equal to $|V_{DSmax}| - |V_p|$ to prevent excess voltage developing across said second active electronic device.

9. A voltage sharing circuit as defined in claim 5, further comprising at least one additional three electrode active electronic device connected in series intermediate said first and second active electronic devices, said additional three electrode active electronic device having first, second and third electrodes.

10. A voltage sharing circuit as defined in claim 9, further comprising a second source of fixed reference voltage and a second diode, said second source of fixed reference voltage being coupled to the third electrode of said additional active electronic device via said second diode to limit the maximum voltage with respect to ground potential on said third electrode of said additional active electronic device and to limit the maximum voltage across said second active electronic device, said first source of fixed reference voltage limiting the maximum voltage across said additional active electronic device.

11. A voltage sharing circuit as defined in claim 10, wherein said semiconductor devices are n-channel, depletion mode JFETs and said second source of fixed reference voltage is nominally equal to $|V_{DSmax}| - |V_p|$ and said first source of fixed reference voltage is nominally equal to the said second source of fixed reference voltage plus $|V_{DSmax}|$.

12. A voltage sharing circuit as defined in claim 10, wherein said second source of fixed reference voltage has a predetermined value to limit the maximum voltage across said first and second electrodes of said second active electronic device to a value less than the maximum voltage across said first and second electrodes of said additional active electronic device, and said first source of fixed reference voltage has a predetermined value to limit the maximum voltage across said first and second electrodes of said additional active electronic device to a value less than the maximum voltage across said first and second electrodes of said first active electronic device.

13. A voltage sharing circuit as defined in claim 1, wherein said first impedance device comprises a first resistor.

14. A voltage sharing circuit as defined in claim 1, wherein said first diode is connected such that its positive-current forward-bias direction is oriented such that bias that would enhance the conduction of said second active electronic device is substantially restricted by said first diode.

15. A voltage sharing circuit as defined in claim 1, wherein said first diode is connected such that its positive-current forward-bias direction is oriented to limit the voltage applied at said third electrode of said second active electronic device, such that voltage at said first electrode of said second active electronic device will nominally track the voltage at said third electrode of said first active electronic device.

16. A voltage sharing circuit as defined in claim 1, wherein said first diode is connected to clip to a predetermined maximum value the voltage, with respect to ground potential, at said third electrode of said second active electronic device, whenever the voltage, with respect to ground potential, at said first electrode of said second active electronic device exceeds a predetermined level.

17. A voltage sharing circuit as defined in claim 1, wherein said first diode is connected such that its positive-current forward-bias direction is oriented for removal by said first diode of bias from said third electrode of said second active electronic device.

18. A voltage sharing circuit as defined in claim 1, wherein said first diode is connected with such orientation that the voltage at said third electrode of said second active electronic device is thereby limited to an absolute level relative to ground, and said second active electronic device acts as a cascode while said first diode is forward conducting.

19. A voltage sharing circuit as defined in claim 1, wherein said first electrode of said first active electronic device is grounded through a resistor.

20. A voltage sharing circuit as defined in claim 2, wherein:
said first and second active electronic devices are n-channel FETs; and
said diode is connected such that its positive-current forward-bias direction is oriented away from said gate electrode of said second active electronic device.

21. A voltage sharing circuit as defined in claim 2, wherein:
said first and second active electronic devices are p-channel FETs; and
said diode is connected such that its positive-current forward-bias direction is oriented towards said gate electrode of said second active electronic device.

22. A voltage sharing circuit as defined in claim 3, wherein:
said first and second active electronic devices are n-p-n bipolar transistors; and
said diode is connected such that its positive-current forward-bias direction is oriented away from said base electrode of said second active electronic device.

23. A voltage sharing circuit as defined in claim 3, wherein:
said first and second active electronic devices are p-n-p bipolar transistors; and
said diode is connected such that its positive-current forward-bias direction is oriented towards said base electrode of said second active electronic device.

24. A voltage sharing circuit as defined in claim 8, wherein said diode is connected such that its positive-current forward-bias direction is oriented away from said gate electrode of said second active electronic device.

25. A voltage sharing circuit as defined in claim 9, further comprising a second impedance device coupling said second and third electrodes of said additional semiconductor device.

26. A voltage sharing circuit as defined in claim 16, wherein said second reference voltage has a predetermined value to limit the maximum voltage across said first and second electrodes of said second semiconductor device to a value less than $|V_{DSmax}|$, and said first reference voltage has a predetermined value to limit the voltage across said first and second electrodes of said additional semiconductor device to a value less than $|V_{DSmax}|$.

27. A voltage sharing circuit, comprising;
a plurality of active electronic devices having at least three electrodes and coupled in a series stack;
means for providing an input signal to a first of said active electronic devices at one end of said series stack;
means for providing an output signal from the last of said active electronic devices at the other end of said series stack; and
means for providing diode limiters to all but said first of said active electronic devices to limit the maximum voltage which can be applied to one corresponding electrode of each but said first, and the maximum voltage that can be developed across all but said second, of said active electronic devices.

28. A voltage sharing circuit as defined in claim 27, wherein each of said diode limiters includes a distinct and different fixed reference voltage associated therewith.

29. A voltage sharing circuit as defined in claim 28, wherein the values of said reference voltages are tapered such that the maximum voltage which can be developed across said second active electronic device is less than the maximum voltage which can be developed across any other of said active electronic devices and the maximum voltage which can be developed across any of said active electronic devices is less than the maximum voltage which can be developed across said first active electronic devices.

30. A voltage sharing circuit as defined in claim 27, further comprising a cascode device intermediate said first of said active electronic devices and the next active electronic device in the series stack.

31. A voltage sharing circuit, comprising:

a first active electronic device having at least first, second and third electrodes;
a second active electronic device having at least first, second and third electrodes, with said first electrode being coupled to said second electrode of said first active electronic device, whereby an input signal applied at only said third electrode of said first active electronic device causes production of an output signal at said second electrode of said second active electronic device;
a supply voltage source coupled to said second electrode of said second active electronic device;
a source of fixed reference voltage;
impedance means for coupling, with a predetermined impedance, said second and third electrodes of said second active electronic device; and
limiting means, operatively connected between said source of reference voltage and said third electrodes of said second active electronic device, for limiting the maximum voltage, with respect to ground potential, on said third electrode of said second active electronic device.

32. A voltage sharing circuit as defined in claim 31, wherein said impedance means comprises a resistor.

33. A voltage sharing circuit as defined in claim 31, wherein said limiting means comprises a diode.

34. A voltage sharing circuit as defined in claim 31, wherein said limiting means comprises means for limiting the voltage, with respect to ground potential, applied at said third electrode of said second active electronic device, such that voltage at said second electrode of said second active electronic device will nominally track the voltage at said third electrode of said first active electronic device.

35. A voltage sharing circuit as defined in claim 31, wherein said limiting means comprises means for clipping to a predetermined maximum value the voltage, with respect to ground potential, at said third electrode of said second active electronic device, whenever the voltage, with respect to ground potential, at said second electrode of said first active electronic device exceeds a predetermined level.

36. A voltage sharing circuit as defined in claim 31, wherein said limiting means comprises means for restricting the maximum voltage, with respect to ground potential, at said third electrode of said second active electronic device, such that when voltage at said second electrode of said first active electronic device exceeds a first predetermined level, the respective voltage at said third and first electrodes of said first active electronic device is held to substantially a second predetermined maximum level.

* * * * *